United States Patent
Wada et al.

(10) Patent No.: US 7,966,721 B2
(45) Date of Patent: Jun. 28, 2011

(54) ELECTRONIC COMPONENT MOUNTING METHOD AND ELECTRONIC COMPONENT MOUNTING DEVICE

(75) Inventors: Yoshiyuki Wada, Fukuoka (JP); Tadahiko Sakai, Fukuoka (JP)

(73) Assignee: Panasonic Corporation, Osaka (JP)

( * ) Notice: Subject to any disclaimer, the term of this patent is extended or adjusted under 35 U.S.C. 154(b) by 481 days.

(21) Appl. No.: 10/590,473

(22) PCT Filed: Dec. 21, 2005

(86) PCT No.: PCT/JP2005/023465
§ 371 (c)(1),
(2), (4) Date: Aug. 23, 2006

(87) PCT Pub. No.: WO2006/070658
PCT Pub. Date: Jul. 6, 2006

(65) Prior Publication Data
US 2007/0175969 A1    Aug. 2, 2007

(30) Foreign Application Priority Data
Dec. 27, 2004   (JP) .................................. 2004-376071

(51) Int. Cl.
*H05K 3/34*   (2006.01)
(52) U.S. Cl. ......... 29/840; 29/832; 29/841; 228/180.22; 361/779
(58) Field of Classification Search .................... 29/832, 29/834, 840–843; 174/255, 258, 534; 228/180.22, 228/223; 257/737, 779, 783; 361/760, 777, 779; 148/23
See application file for complete search history.

(56) References Cited

U.S. PATENT DOCUMENTS

| | | | | |
|---|---|---|---|---|
| 4,749,120 A * | 6/1988 | Hatada | ...................... | 228/180.22 |
| 5,726,861 A * | 3/1998 | Ostrem | ......................... | 361/777 |
| 6,402,013 B2 * | 6/2002 | Abe et al. | ...................... | 228/223 |
| 6,521,997 B1 * | 2/2003 | Huang et al. | ................. | 257/783 |
| 2009/0053459 A1 | 2/2009 | Hirose et al. | | |

FOREIGN PATENT DOCUMENTS

| | | |
|---|---|---|
| JP | 58-166070 U | 11/1983 |
| JP | S57-63586 | 11/1983 |
| JP | 7-45927 A | 2/1995 |
| JP | 9-167890 A | 6/1997 |
| JP | 2004-146433 A | 5/2004 |
| KR | 2001-0093184 A | 10/2001 |

OTHER PUBLICATIONS

International Search Report for PCT/JP2005/023465, dated Jan. 24, 2006.

* cited by examiner

*Primary Examiner* — Donghai D. Nguyen
(74) *Attorney, Agent, or Firm* — RatnerPrestia (57) ABSTRACT

In order to mount an electronic component, a connection terminal of the electronic component is bonded to electrodes of a substrate. This is done by using solder paste which mixes solder particles in a thermosetting adhesive. The solder paste is supplied to the electrodes and a recess. Solder print parts are formed. The electronic component is mounted and the connection terminal and the main body of the electronic component are adhered to the solder print parts, and are heated in this state by reflow. As a result, the connection terminal and the electrodes are bonded by a solder junction.

4 Claims, 7 Drawing Sheets

ELECTRONIC COMPONENT MOUNTING METHOD AND ELECTRONIC COMPONENT MOUNTING DEVICE

THIS APPLICATION IS A U.S. NATIONAL PHASE APPLICATION OF PCT INTERNATIONAL APPLICATION PCT/JP2005/023465.

TECHNICAL FIELD

The present invention relates to an electronic component mounting method for mounting an electronic component on a substrate by soldering, and an electronic component mounting device.

BACKGROUND ART

Soldering method is widely known as a method of mounting an electronic component on a substrate. When the electronic component to be mounted is a small part to be used in a portable appliance, if a sufficient soldering area is not available and the solder amount is small in the junction, it is attempted to reinforce the solder junction by a resin adhesive. Or if the strength of soldering material is low and it is hard to assure enough junction strength, the solder junction is often reinforced by resin adhesive. Such technology is disclosed, for example, in Japanese Patent Application Laid-Open No. 2004-146433.

However, such mounting reinforcing method of solder junction by resin adhesive has the following problems. First, this method additionally requires an extra step of applying resin by dispenser or the like for supplying the resin adhesive to the substrate or electronic component, and the manufacturing process is complicated and the manufacturing cost is increased. At the same time, if the electronic component is small, it is hard to assure necessary space for supplying the resin adhesive. Or if the resin adhesive is applied around the electronic component after it is mounted, it is hard to form a resin reinforced part having enough reinforcing effect by invading the resin adhesive into a small gap of electronic component and substrate in the case of a small part, and the junction reliability after mounting is not assured.

DISCLOSURE OF THE INVENTION

The electronic component mounting method of the invention is a method of mounting an electronic component for mounting an electronic component on a substrate by soldering a connection terminal of electronic component to an electrode provided on a substrate, comprising an adhesive supplying step of supplying a thermosetting adhesive mixing solder particles to a substrate, a component mounting step of mounting an electronic component on the substrate after the adhesive supplying step, and a heating step of heating the substrate after the component mounting step, in which the adhesive supplying step is characterized by supplying the adhesive to the electrode, and also supplying the adhesive to an adhesion reinforcing portion determined outside of the electrode on the substrate, the component mounting step is characterized by fitting the connection terminal to the adhesive supplied on the electrode, and also fitting the electronic component to the adhesive supplied in the adhesion reinforcing portion, and the heating step is characterized by forming a solder junction by bonding the connection terminal and electrode by fusing the solder particles in the adhesive supplied to the electrode, and also forming an adhesion reinforced part for fixing the electronic component to the substrate by heating and curing the adhesive by sealing the inside of the adhesive with solder part by fusing and solidifying of solder particles contained in the adhesive supplied in the adhesion reinforcing portion.

The electronic component mounting structure of the invention is a structure of mounting an electronic component for mounting an electronic component on a substrate by a thermosetting adhesive mixing solder particles, comprising a solder junction of bonding an electrode and a connection terminal formed by fusing and solidifying of solder particles in the adhesive supplied in the electrode, and an adhesion reinforcing unit for fixing the electronic component to the substrate by heating and curing of adhesive, by sealing the inside of adhesive with solder part formed by fusing and solidifying of solder particles in the adhesive, being formed in the adhesion reinforcing portion determined outside of the electrode portion on the substrate.

According to an embodiment of the invention, in mounting of electronic component by using a thermosetting adhesive mixing solder particles, by supplying the adhesive to the adhesion reinforcing portion determined outside of portion other than the electrode on the substrate, and forming the adhesion reinforced part for fixing the electronic component to the substrate by heating and curing the adhesive in reflow, a favorable reinforcing effect is assured resin reinforcement, and the junction reliability is enhanced.

DESCRIPTION OF THE REFERENCE NUMERALS

1 Substrate
2 Electrode

2a Reinforcing electrode
3 Resist film
3a Connection opening
3b Recess
3c Reinforcing opening
4 Solder paste
4A, 4B Solder print part
5 Electronic component
5a Connection terminal
5b Main body
6a Solder junction
6b Solder part
7a First resin reinforcing part
7b Second resin reinforcing part

DETAILED DESCRIPTION OF THE PREFERRED EMBODIMENTS

Preferred Embodiment 1

Figure 2A:
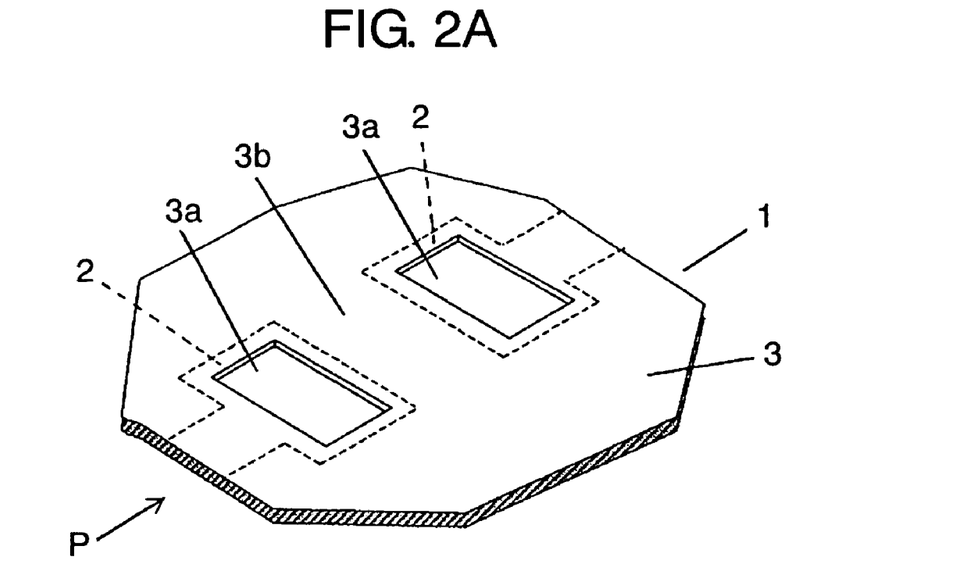
FIG. 2A is a perspective view of substrate on which electronic component of preferred embodiment 1 of the invention is mounted.
Figure 2B:
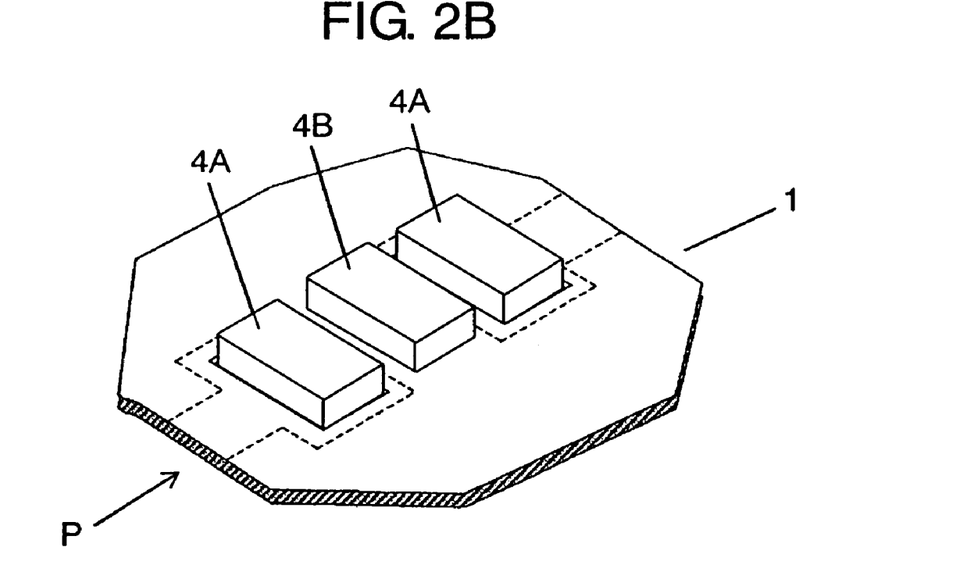
FIG. 2B is a perspective view of substrate in FIG. 2A in which solder print part is formed.
Figure 3:
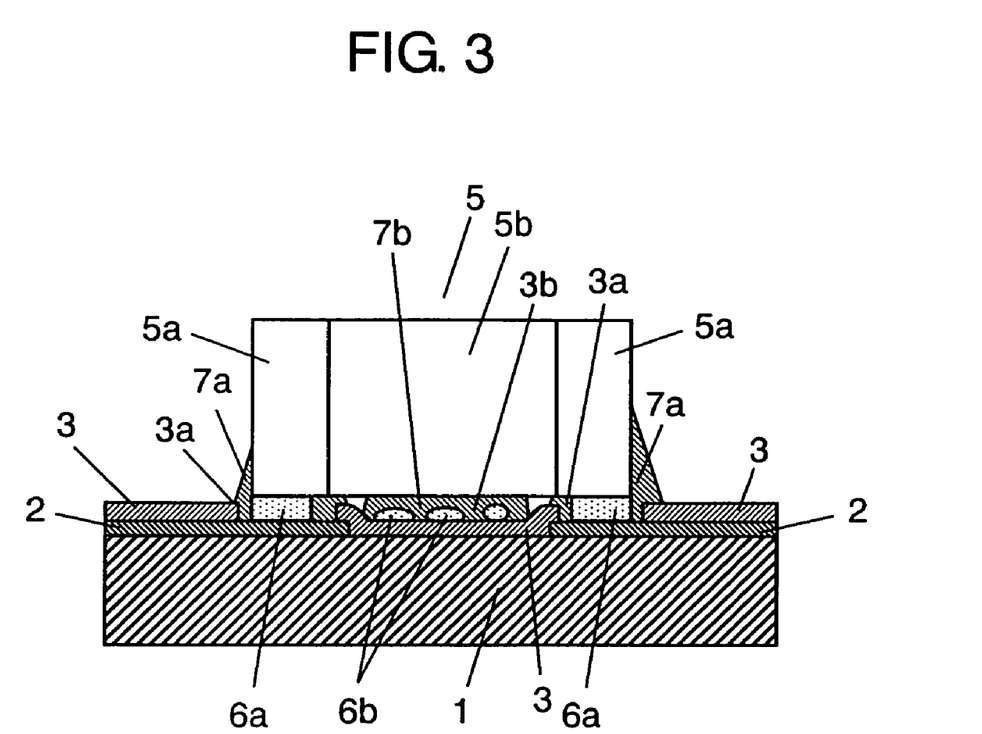
FIG. 3 is a sectional view of electronic component mounting structure in preferred embodiment 1 of the invention.
Figure 4A:
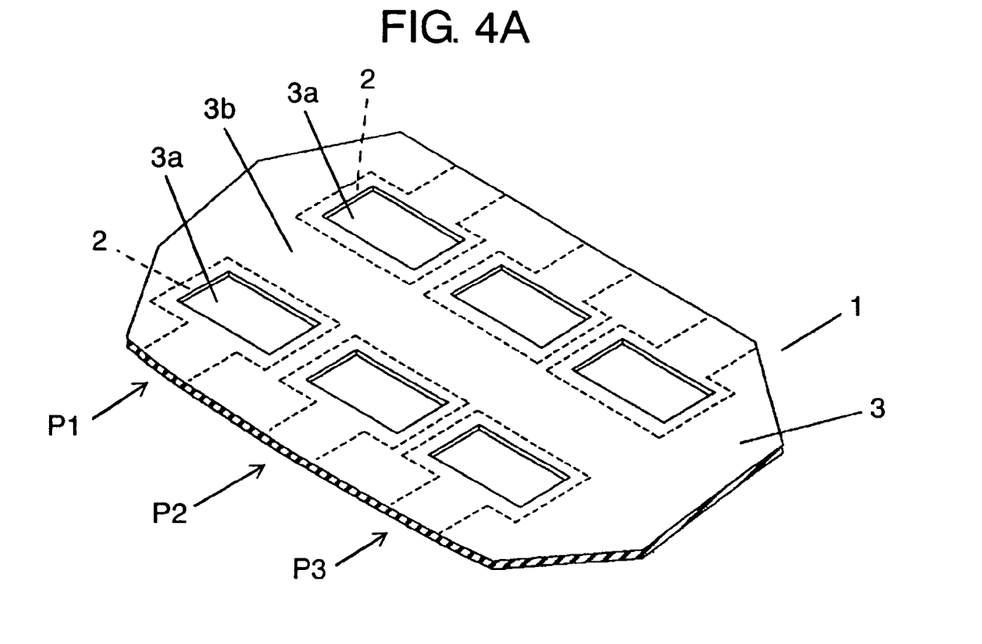
FIG. 4A is a perspective view of substrate on which electronic component of preferred embodiment 1 of the invention is mounted.
Figure 4B:
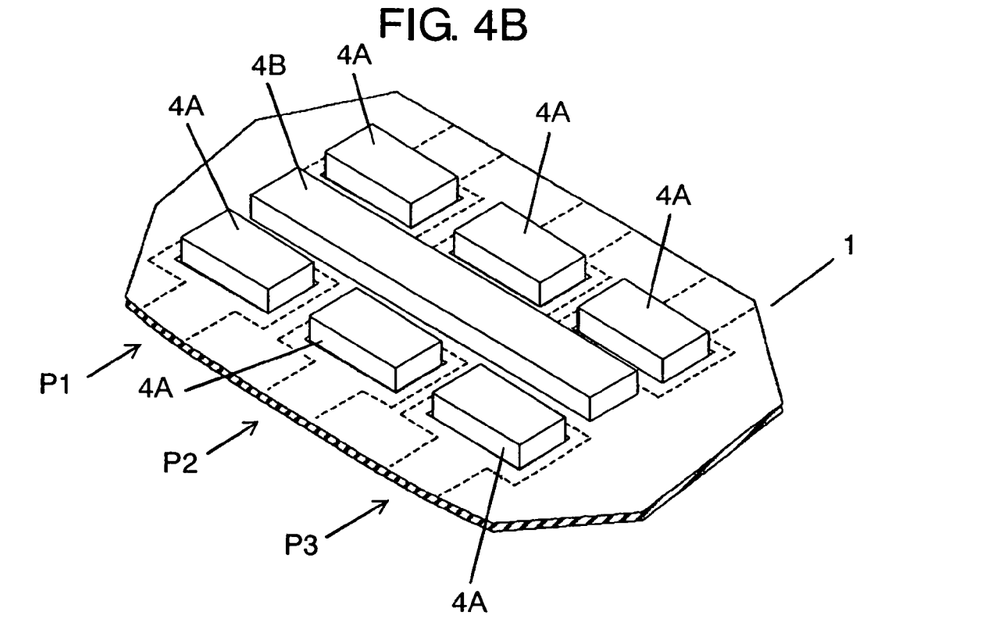
FIG. 4B is a perspective view of substrate in FIG. 4A in which solder print part is formed.

FIG. 1A to FIG. 1D are process explanatory diagrams showing an electronic component mounting method in preferred embodiment 1 of the invention. FIG. 2A and FIG. 4A are perspective views of substrate on which electronic component of preferred embodiment 1 of the invention is mounted. FIG. 2B is a perspective view of substrate in FIG. 2A in which solder print part is formed. FIG. 4B is a perspective view of substrate in FIG. 4A in which solder print part is formed. FIG. 3 is a sectional view of electronic component mounting structure in preferred embodiment 1 of the invention.

The electronic component mounting method in preferred embodiment 1 of the invention is a method of mounting a connection terminal of electronic component on a substrate by soldering to an electrode provided on the substrate. FIG. 1A to FIG. 1D show the section of component mounting position P on which electronic component is mounted on substrate 1 shown in FIG. 2A and FIG. 2B.

Figure 1A:
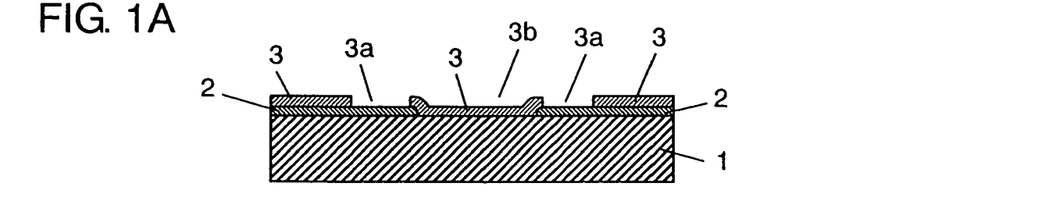
FIG. 1A is a sectional view explaining a step of electronic component mounting method in preferred embodiment 1 of the invention.

In FIG. 1A, a pair of electrodes 2 connected to the electronic component are formed on the substrate 1. As shown in FIG. 2A, electrodes 2 are extended oppositely from two directions toward the component mounting position P, and a resist film 3 covering the electrodes 2 is formed on the upside of the substrate 1. The resist film 3 has two connection openings 3a for connecting the electronic component to be mounted, and the electrodes 2 are exposed in the connection openings 3a.

Height of upside of resist film 3 is different by the portion corresponding to the thickness of electrodes 2 between the portion covering the electrodes 2 and the portion directly formed on the substrate 1. As shown in FIG. 1A, the resist film 3 is formed directly on the surface of substrate 1 in the intermediate part of the two connection openings 3a. Accordingly, the upside of the portion of the resist film 3 directly formed on the surface of the substrate 1 is lower than the upside of the resist film 3 covering the electrodes 2. A recess 3b of concave upside is formed on the section of the resist film 3.

Figure 1B:
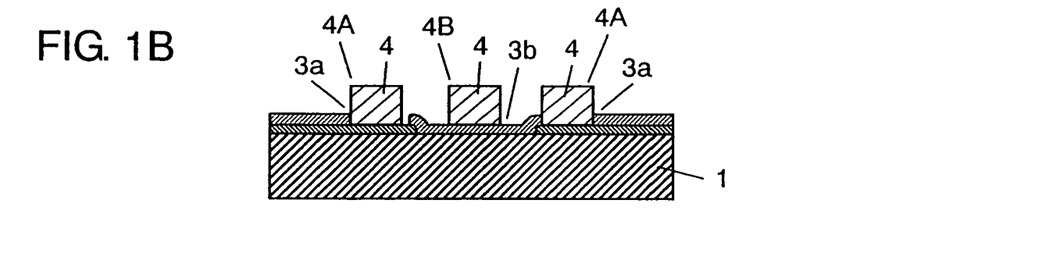
FIG. 1B is a sectional view showing a step sequential to FIG. 1A.

At the adhesive supplying step, the substrate 1 is sent into a screen printing device, and solder paste mixing solder particles in adhesive is supplied on the upside of the substrate 1 by printing. That is, as shown in FIG. 1B and FIG. 2B, solder paste 4 is printed simultaneously in the connection opening 3a and recess 3b at the same printing step, and solder print parts 4A, 4B are formed. The recess 3b is an adhesion reinforcing portion determined outside of the connection opening 3a at the component mounting position P of the substrate 1. As described below, adhesion reinforced part for fixing the electronic component and substrate is formed by the solder paste 4 supplied to the recess 3b.

That is, at the adhesive supplying step, solder paste 4 is supplied to the electrodes 2a of the connection openings 3a, and solder paste 4 is also supplied to the adhesive reinforcing portion determined outside of the connection opening 3a on the substrate 1. Herein the adhesion reinforcing portion is formed on the recess 3b, that is, on the resist film 3 showing a concave shape in a portion other than the electrodes 2 by the resist film 3 partly overlapping with the two electrodes 2.

The solder paste 4 is explained. The solder paste 4 is a mixture of metal component containing solder particles and thermosetting adhesive. The thermosetting adhesive is, for example, thermosetting flux containing thermosetting resin and solid resin and having activity for removing solder oxide film. The solid resin is solid at ordinary temperature, and is changed to liquid by heating. The solid resin is used, as described below, as plasticizer having functions of enhancing the fluidity of adhesive component in reflow, and increasing the strength of resin reinforcing part by solidifying after being cooled.

Herein, the solder is so-called lead-free solder not containing lead component. In the case of a component desired to set the heating temperature as low as possible, it is preferred to select Sn (tin)—Bi (bismuth) solder (liquidus temperature 139° C.). Solder of Sn—Bi compound can enhance the solder strength by adding Ag (silver) by blending ratio of 1 wt. % to 3 wt. %. Such solder contains particles by blending ratio of 70 wt. % to 92 wt. % in solder paste.

As metal components, aside from solder particles, metal powder is blended by blending ratio of 0.5 wt. % to 10 wt. % in a form of metal foil of Ag (silver), Pd (palladium), or Au (gold). As a result, the solder junction strength is enhanced. In other words, such metals have properties of higher melting point than the melting point of solder, not forming oxide film in atmosphere, and smooth wettability of fluidized solder of dissolved solder particles along the surface. Hence, in the solder junction process by reflow, these metal powder particles form nuclei to enhance the wettability of solder by agglutinating the fused solder.

As solid resin, a combination of liquidus temperature of solder higher than the softening temperature of solid resin is selected. By selecting such combination, as described below, there is a low possibility of disturbance of fluidity of fused solder by resin component in the solder paste 4 in reflow process, and favorable solder junction is achieved.

Figure 1C:
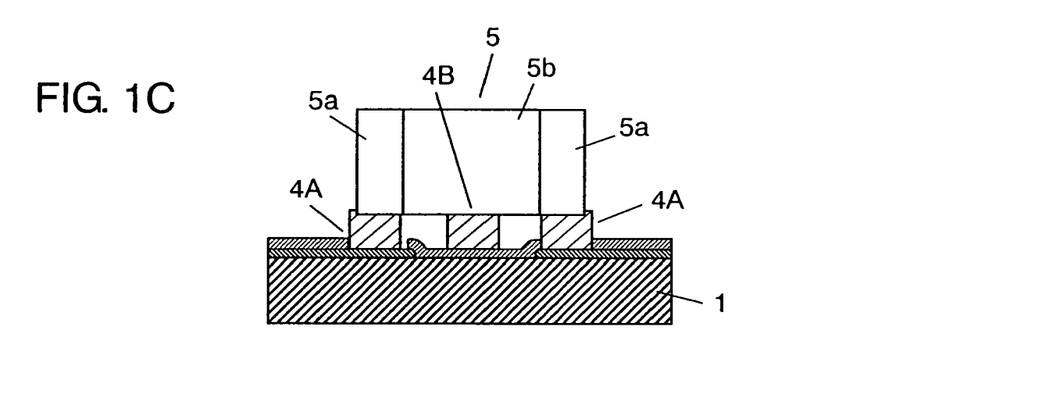
FIG. 1C is a sectional view showing a step sequential to FIG. 1B.

At the subsequent component mounting step, a chip-type electronic component 5 is mounted on a substrate 1. That is, as shown in FIG. 1C, an electronic component 5 in a structure having connection terminal 5a disposed at both ends of main body 5b is mounted at component mounting position P. At this component mounting step, connection terminal 5a is fitted to solder print part 4A in the connection opening 3a, and the downside of main body 5b is fitted to the solder print part 4B formed in the recess 3b at adhesion reinforcing portion. As a result, the electronic component 5 is temporarily fixed by the adhesive power of the solder paste 4.

Figure 1D:
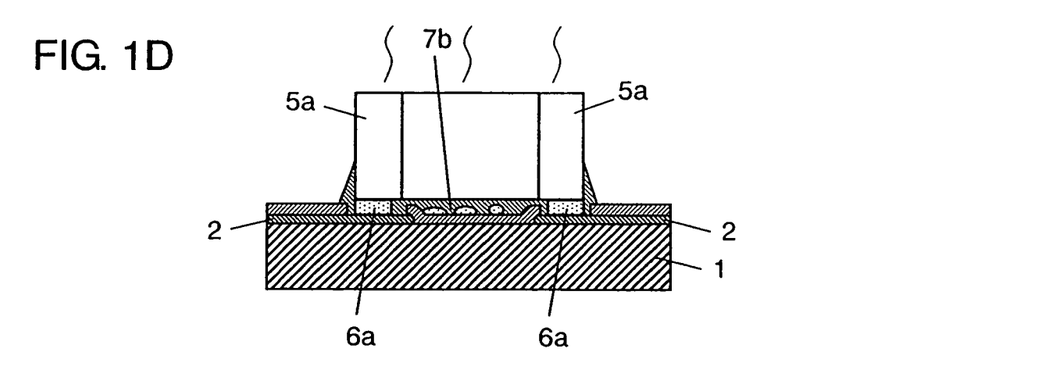
FIG. 1D is a sectional view showing a step sequential to FIG. 1C.

At the subsequent heating step, the substrate 1 mounting the electronic component 5 is sent into a reflow device, and is heated higher than the liquidus temperature of solder in the solder paste 4. By this heating, as shown in FIG. 1D, solder particles in the solder print parts 4A, 4B are fused. At the same time, curing reaction of thermosetting resin in the adhesive components is promoted, and the solid resin is liquefied in simultaneous and parallel operation. In the subsequent cooling process, the subsequent 1 is unloaded from the reflow device and returned to ordinary temperature, and the solid resin and fused resin in the solder paste 4 are solidified.

FIG. 3 is a sectional view of electronic component mounting structure in preferred embodiment 1 of the invention. In this heating process, fused solder fusing solder particles in the solder print part 4A formed in the connection opening 3a wets the electrodes 2 and connection terminal 5a. In the subsequent cooling process, by solidifying in this state, solder junction 6a for boding the electrodes 2 and connection terminal 5a is formed. Around the solder junction 6a, the resin components in the solder print part 4A, that is, thermosetting resins are cured, and the solid resin is solidified, and a first resin reinforced part 7a in fillet shape is formed.

In the solder print part 4B supplied in the recess 3b, similarly, solder particles are fused, but since there is no wetting object of fused solder in the recess 3b, certain solder lumps 6b are formed in the adhesive component in fluid state. At this time, as mentioned above, since the upside of the recess 3b is lower than the upside of the resist film 3 covering the electrode 2, the solder part 6b in fluid state does not disperse as solder balls, but is maintained at the same position. In the recess 3b, an adhesion reinforced part by the adhesive component in the solder print part 4B, that is, a second resin reinforced part 7b is formed. The second resin reinforced part 7b is formed as the thermosetting resin is cured and the solid resin component is solidified in the gap of downside of main body 5b and upside of resist film 3.

That is, in this heating process, solder particles in the solder print part 4A are fused, and a solder junction 6a for bonding the connection terminal 5a and electrode 2 is formed. At the same time, solder particles in the solder print part 4B are fused and solidified, and the solder part 6b fills and seals the inside of the adhesive, and the adhesive component is heated and cured, and the second resin reinforced part 7b is formed for fixing the main body 5b of the electronic component 5 to the substrate 1.

As a result, the mounting structure is formed as shown in FIG. 3, in which the electronic component 5 is mounted on the substrate 1 by solder paste 4, and the electronic component mounting structure is completed. This mounting structure includes the solder junction 6a and second resin reinforced part 7b. The solder junction 6a is formed as the solder particles in the solder print part 4A are fused and solidified, and the connection terminal 5b and electrode 2 are bonded. The second resin reinforced part 7b is formed in the recess 3b at the adhesion reinforcing portion determined outside of the electrode 2 on the substrate 1, and the solder part 6b of fused and solidified solder particles in the solder print part 4B fills in the adhesive, and the adhesive component in the solder paste 4 is heated and cured, and the main body 5a of the electronic component 5 is fixed to the substrate 1.

The adhesion reinforcing portion in preferred embodiment 1 is set on the recess 3b between two connection openings 3a, and the solder part 6b is held in a concave portion. That is, the adhesion reinforcing portion is formed on the substrate 1, and partly overlaps with plural electrodes 2, and hence the portion other than the electrodes 2 is set on the concave resist film 3.

As shown in FIG. 4A, if component mounting positions P1, P2, P3 are present on the substrate 1 at narrow pitches, instead of forming the solder print parts 4B individually at component mounting positions, as shown in FIG. 4B, a continuous solder print part 4B may be formed to cover all component mounting positions P1, P2, P3. The solder print part 4B is supplied merely for the purpose of forming the adhesion reinforcing portion for fixing the electronic component main body to the substrate. Accordingly, by supplying the continuous solder print part 4B covering all component mounting positions, there is no problem such as short-circuiting of electrodes.

In the solder fusing process of the mounting method of electronic component, the solid resin of the adhesive component contained in the solder paste 4 is changed to liquid. As a result, the adhesive component does not lose its fluidity in a state heated to solder fusing temperature, and self-alignment phenomenon of fused solder is not disturbed. That is, curing of thermosetting resin by heating at the time of reflow causes to lower the fluidity of adhesive component, but since the solid resin is liquefied simultaneously by heating, drop of fluidity can be compensated by liquefaction of solid resin.

As a result, in reflow process, aggregation of fused solder is less likely to be disturbed by adhesive component, and the fused solder can be aggregated, and a solder junction of favorable shape is formed. In the gap between the main body 5b and resist film 3, the adhesive component flows smoothly without losing fluidity, and fills the gap without forming voids, so that the second resin reinforced part 7b having a sufficient reinforcing effect is formed.

Upon completion of soldering process, the adhesive component is cured as the thermosetting resin is completely heated and cured, and the solid resin once liquefied by heating is cooled to ordinary temperature and solidified again, and returns to a complete solid form. As a result, the first resin reinforced part 7a for reinforcing the solder junction 6a, and the second resin reinforced part 7b for fixing the main body 5b and substrate 1 can be formed rigidly. That is, the thermally cured thermosetting resin and the cooled and solidified plasticizer become solid in miscible state, and the resin reinforced parts are formed to cover the solder junction. Therefore, if brittle lead-free solder of low melting point and inferior in junction strength is used, the solder junction 6a is reinforced by resin reinforced part 7a. At the same time, the main body 5b of the electronic component 5 can be firmly fixed to the substrate 1, and if used in an appliance exposed to vibration or impact, the junction reliability can be enhanced substantially.

Composition of solder paste 4 is specifically described below. The solder paste 4 is composed, as mentioned above, by mixing solder particles in adhesive component containing thermosetting resin. In this preferred embodiment, the adhesive component contains epoxy as main ingredient in basic composition. It further comprises hardener for thermally curing the main ingredient, hardening promoter, active agent for removing the oxide film of solder, plasticizer composed of thermoplastic solid resin, and solvent.

In this basic composition, types and blending ratio of components are explained. The main ingredient is hydrogenated bisphenol A epoxy resin (30 wt. % to 45 wt. %). The hardener is methyl tetrahydrophthalate anhydride (30 wt. % to 45 wt. %). The hardening promoter is 2-phenyl 4-methyl 5-hydoxymethyl imidazole (1 wt. % to 2 wt. %). The active agent is m-hydroxy benzoic acid (3 wt. % to 10 wt. %). The plasticizer is alkyl phenol denatured xylene resin (2 wt. % to 20 wt. %). The solvent is butyl carbitol (0 wt. % to 5 wt. %).

These components may be also replaced by the following substitutes. The main ingredient is not limited to hydrogenated bisphenol A epoxy resin, and may be selected from 3,4 epoxy cyclohexenyl methyl-3',4' epoxy cyclohexene carboxylate, bisphenol F epoxy resin, and bisphenol A epoxy resin. The hardener is not limited to methyl tetrahydrophthalate anhydride, but may include methyl hexahydrophtalate anhydride. The hardening promoter is not limited to 2-phenyl 4-methyl 5-hydoxymethyl imidazole, but may include 2-phenyl 4,5 dihydroxy methyl imidazole.

The active agent is not limited to m-hydroxy benzoic acid, but may include mesaconic acid. The plasticizer is not limited to alkyl phenol denatured xylene resin, but may include fatty acid amide or high polymerization rosin. The solvent is not limited to butyl carbitol, but may include methyl carbitol. The blending ratio of these substitute components is basically same as the values shown in the basic composition. Acid anhydride used as hardener has an activity for removing oxide film, and blending of active agent may be omitted.

The thermosetting resin is not limited to the epoxy system of main ingredient, but may contain, to be mixed in the thermosetting resin, at least one of acrylic system, urethane system, phenol system, urea system, melamine system, unsaturated polyester system, amine system, and silicon system. Solid resin used as plasticizer contains at least one of terpene resin, phenol resin, xylene resin, urea resin, melanine resin, noncrystalline rosin, imide resin, olefin resin, acrylic resin, amide resin, polyester resin, styrene, polyimide, and fatty acid derivative.

When selecting these solid resins, a solid resin miscible with main ingredient is selected in relation to the component of main ingredient. Thus, when mixing the solid resin in the main ingredient, a fluid liquid resin is obtained without using solvent containing volatile gas component. As a result, gas components do not deposit in the reflow apparatus by gas evaporating from solvent, and the environmental impact by use of solvent can be decreased.

Preferred Embodiment 2

Figure 5A:
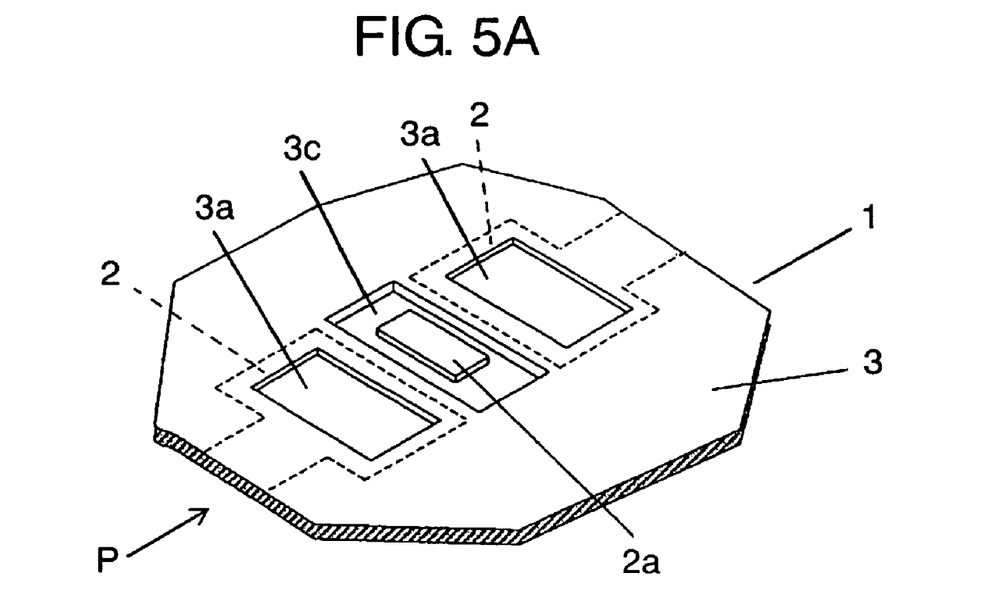
FIG. 5A is a perspective view of substrate on which electronic component of preferred embodiment 2 of the invention is mounted.
Figure 5B:
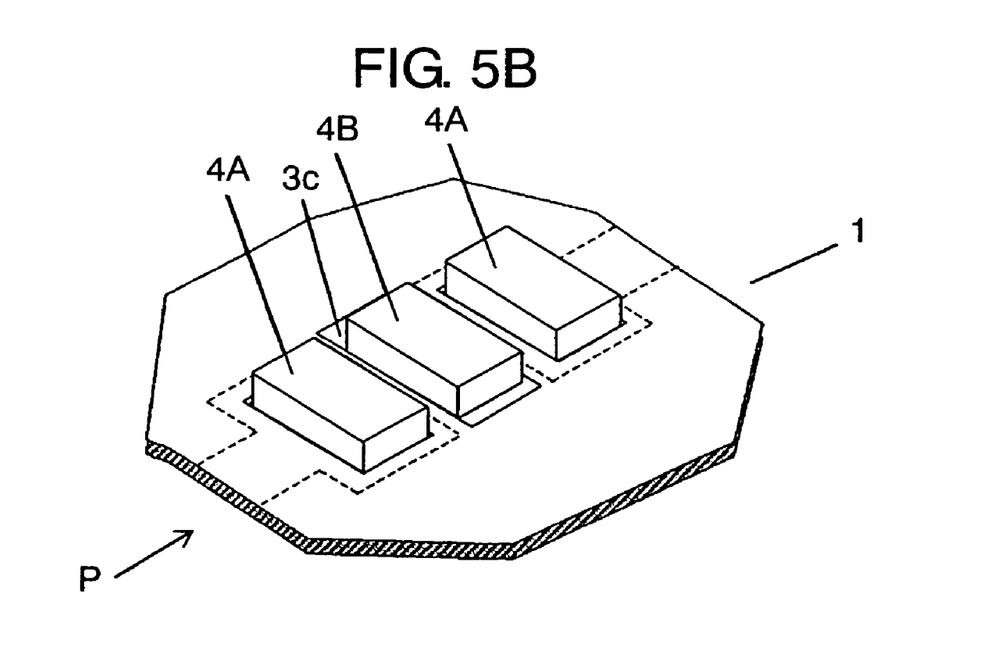
FIG. 5B is a perspective view of substrate in FIG. 5A in which solder print part is formed.
Figure 6:
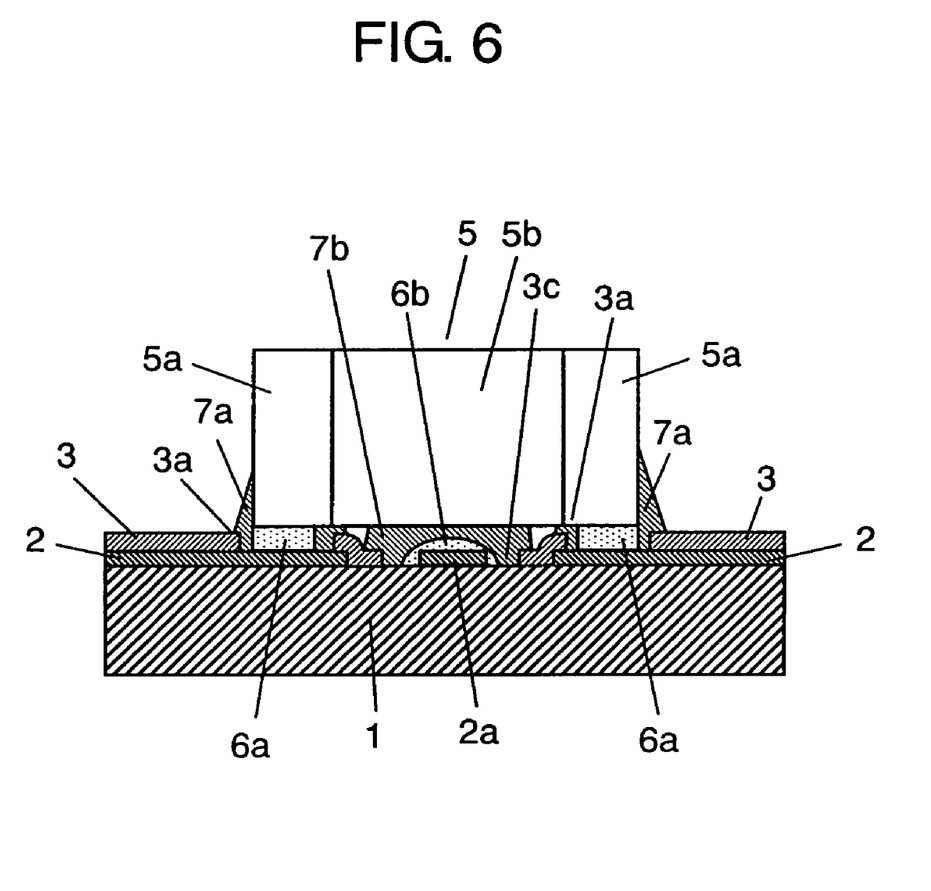
FIG. 6 is a sectional view of electronic component mounting structure in preferred embodiment 2 of the invention.
Figure 7A:
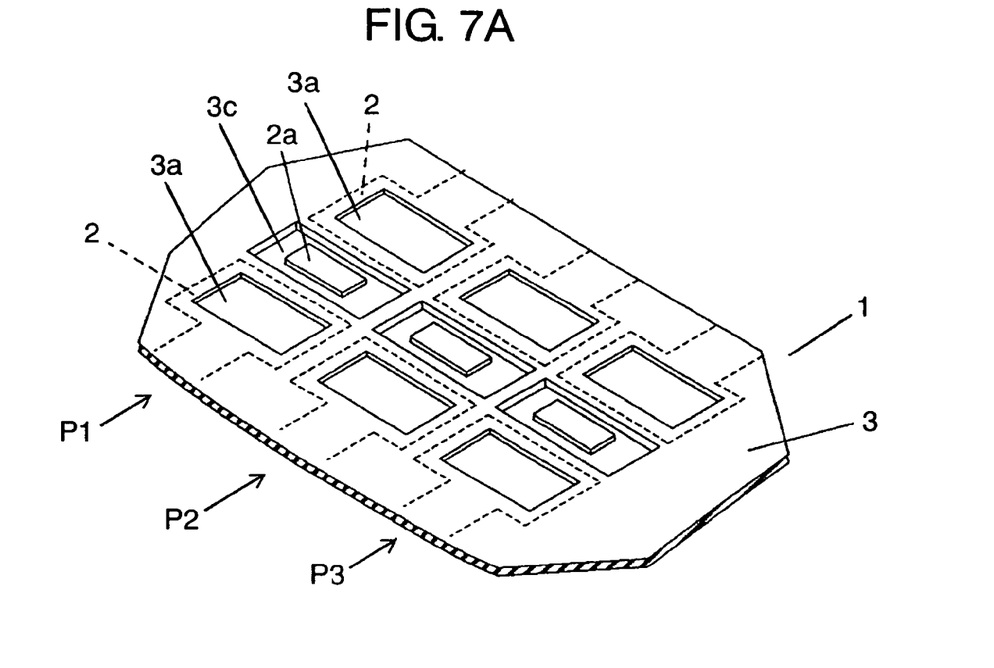
FIG. 7A is a perspective view of substrate on which electronic component of preferred embodiment 2 of the invention is mounted.
Figure 7B:
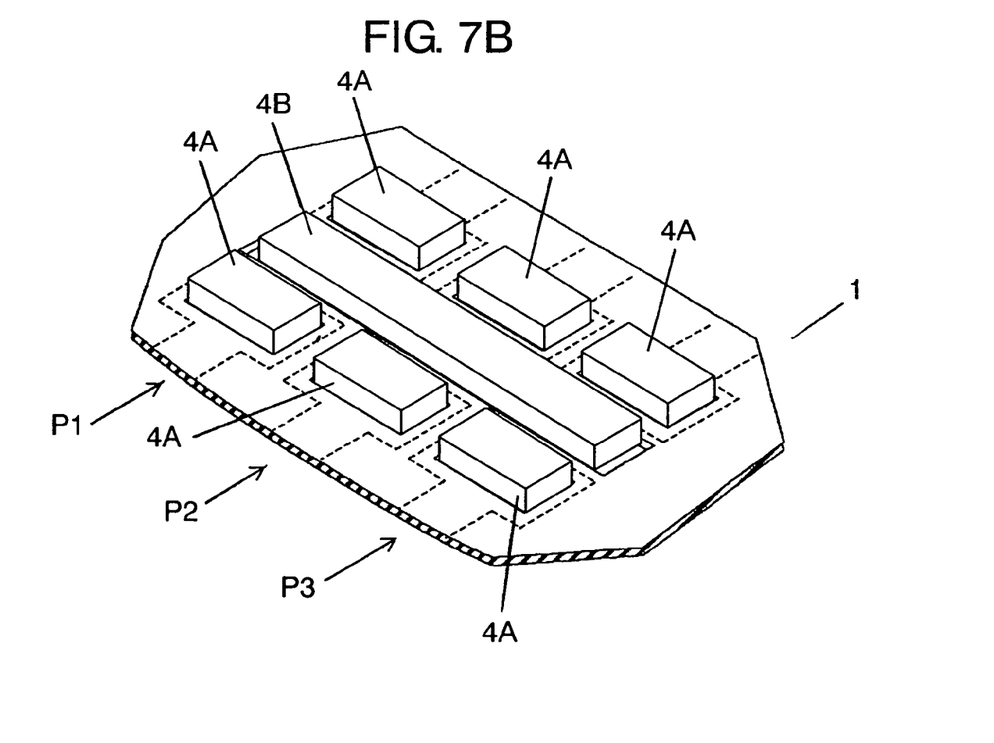
FIG. 7B is a perspective view of substrate in FIG. 7A in which solder print part is formed.

FIG. 5A and FIG. 7A are perspective views of substrate on which electronic component of preferred embodiment 2 of the invention is mounted. FIG. 5B is a perspective view of substrate in FIG. 5A in which solder print part is formed. FIG. 7B is a perspective view of substrate in FIG. 5A in which solder print part is formed. FIG. 6 is a sectional view of electronic component mounting structure in preferred embodiment 2 of the invention.

In FIG. 5A and FIG. 6, at component mounting position P of substrate 1, same as in preferred embodiment 1, electrodes 2, resist film 3, and connection openings 3a are formed. In the middle of two connection openings 3a, a reinforcing opening 3c is provided, and the upside of the substrate 1 is exposed, and reinforcing electrode 2a of same material as electrode 2 is formed on the upside of the substrate 1 in the reinforcing opening 3c. The reinforcing electrode 2a is not related to the wiring circuit pattern of substrate 1. The reinforcing electrode 2a has a function of anchor for fixing the position by fusing the solder component in the solder paste supplied between the main body 5b and substrate 1 for reinforcement of adhesion as described below.

As shown in FIG. 5B, in the opening 3a and reinforcing opening 3c, same as in preferred embodiment 1, solder paste 4 is supplied at the adhesive supplying step and solder print parts 4A, 4B are formed. That is, at the adhesive supplying step, solder paste 4 is supplied to the electrode 2, and solder print part 4A is formed, and solder paste 4 is supplied to cover the reinforcing electrode 2a formed in other portion than the electrode 2 on the substrate 1, and solder print part 4B is formed.

At the subsequent component mounting step, on the substrate 1 on which solder paste is supplied, a chip type electronic component 5 is mounted same as in preferred embodiment 1. At this component mounting step, connection terminal 5a is fitted to solder print part 4A, and the main body 5b of the electronic component 5 is fitted to the solder print part 4B. At the heating step, the substrate 1 on which the component is mounted is heated by reflow apparatus. At the cooling step, the substrate 1 is removed from the reflow apparatus, and the substrate 1 is cooled to ordinary temperature. At the heating step and cooling step, same as in preferred embodiment 1, a solder junction 6a for bonding the electrode 2 and connection terminal 5a is formed, and a first resin reinforcing part 7a in fillet shape is formed around the solder junction 6a.

In the reinforcing opening 3c, solder particles in the solder print part 4B are fused to wet the reinforcing electrode 2a, and solidified in this state, and a solder part 6b bonded to the reinforcing electrode 2a is formed. To cover the solder part 6b, a second resin reinforcing part 7b is formed for fixing the electronic component 5 to the substrate 1 by the adhesive component of solder paste 4B. That is, the second resin reinforced part 7b is formed as the thermosetting resin is cured in the gap between the downside of main body 5b and upside of substrate 1, and the solid resin is solidified. The solder part 6b does not have useful function in the mounting structure, but the position is fixed as the solder component in the solder paste 4B is affixed to the reinforcing electrode 2a. Accordingly, it is effective to prevent problems such as short-circuiting by scattering of solder balls after soldering.

That is, at the heating step, solder particles in the solder print part 4A are fused, and a solder junction 6a for bonding the connection terminal 5a and electrode 2 is formed. At the same time, solder particles in the solder print part 4B are fused, and the solder part 6b bonded on the reinforcing electrode 2a is covered, and the adhesive component is thermally cured, and a second resin reinforced part 7b is formed for fixing the main body 5b of electronic component 5 to the substrate 1.

As a result, the mounting structure is formed as shown in FIG. 6, in which the electronic component 5 is mounted on the substrate 1 by solder paste 4, and the electronic component mounting structure is completed. This mounting structure includes the solder junction 6a and second resin reinforced part 7b (adhesion reinforced part). The solder junction 6a is formed as the solder particles in the solder print part 4A are fused and solidified, and the connection terminal 5a and electrode 2 are bonded. The second resin reinforced part 7b covers the solder part 6b, and the adhesive component of the solder paste 4 is thermally cured, and the electronic component 5 is fixed to the substrate 1. The solder part 6b is formed in the reinforcing electrode 2a formed in other portion than the electrode 2 on the substrate 1, and solder particles in the solder paste 4 are fused and solidified, and bonded to the reinforcing electrode 2a.

As shown in FIG. 7A, if component mounting positions P1, P2, P3 are present on the substrate 1 at narrow pitches, instead of forming the solder print parts 4B individually at component mounting positions, as shown in FIG. 7B, a continuous solder print part 4B may be formed to cover all component mounting positions P1, P2, P3.

As described herein, in the electronic component mounting method of the invention, solder paste mixing solder particles and thermosetting adhesive is used. The solder paste 4 is supplied preliminarily to the adhesion reinforcing portion, and the adhesive component of the solder paste 4 is thermally cured in the reflow, and the adhesion reinforcing position for fixing the electronic component 5 to the substrate 1 is formed. As the adhesion reinforcing position, the recess 3b or reinforcing electrode 2a set in other portion than the electrode 2 on the substrate 1 can be utilized.

Accordingly, unlike the conventional resin prior coating process, no extra process is needed for supplying the resin adhesive to the substrate or electronic component. Hence, the resin reinforced parts can be formed at low process cost. Prior to mounting of electronic component, since the solder paste 4 is supplied on the substrate, if small parts for portable appliance are mounted at narrow pitches, the adhesive component is cured in the gap between the electronic components and substrate, and resin reinforced parts can be formed. Sufficient reinforcing effects are obtained in application demanding reinforcement in consideration of vibration or impact.

INDUSTRIAL APPLICABILITY

The electronic component mounting method and electronic component mounting structure of the invention brings about excellent effects of enhancing the junction reliability with favorable reinforcing effects by resin reinforcement, and is usable in application of mounting of electronic component on substrate by soldering.

The invention claimed is:

1. An electronic component mounting method for mounting the electronic component on a substrate by soldering a connection terminal disposed at both ends of a main body of the electronic component to a pair of electrodes provided on the substrate, comprising an adhesive supplying step of supplying a thermosetting adhesive mixing solder particles to the substrate, a component mounting step of mounting the electronic component on the substrate after the adhesive supplying step, and a heating step of heating the substrate after the component mounting step, wherein the adhesive supplying step is characterized by supplying the adhesive to the electrode, and also supplying the adhesive to an adhesion reinforcing portion determined between the pair of electrodes on the substrate, the component mounting step is characterized by fitting the connection terminal to the adhesive supplied on the electrode, and also fitting the main body to the adhesive supplied in the adhesion reinforcing portion causing a portion of a surface of the main body to contact the adhesive, and the heating step is characterized by forming a solder junction by bonding the connection terminal and electrode by fusing the solder particles in the adhesive supplied to the electrode, and also forming an adhesion reinforced part for fixing the main body to the substrate by heating and curing the adhesive by sealing the inside of the adhesive with solder part by fusing and solidifying of solder particles contained in the adhesive supplied in the adhesion reinforcing portion causing the adhesive to spread and contact a larger portion of the surface of the main body, wherein the adhesion reinforcing portion is formed on the surface of the substrate, extends continuously between and partly overlaps the pair of electrodes to prevent short circuiting of the pair of electrodes, and a portion of the adhesive other than the adhesive supplied to the electrodes is set on a concave resist film of the adhesion reinforcing portion, and the solder part is held in the concave portion.

2. The electronic component mounting method of claim 1, wherein the adhesion reinforcing portion is a position for covering a reinforcing electrode provided between the pair of electrodes on the substrate, and the adhesion reinforced part is formed as the solder particles in the adhesive supplied in the reinforcing electrode are fused to cover the solder part bonded on the reinforcing electrode, and the adhesive is thermally cured to bond the main body to the substrate.

3. An electronic component mounting structure for mounting an electronic component having a connection terminal disposed at both ends of a main body on a substrate with a pair of electrodes by a thermosetting adhesive mixing solder particles, the thermosetting adhesive contacting a portion of a surface of the main body, the structure comprising:

a soldering unit of bonding the pair of electrodes and the connection terminal formed by fusing and solidifying of the solder particles in the adhesive supplied in the pair of electrodes, and an adhesion reinforcing unit for fixing the main body to the substrate by heating and curing of adhesive, by sealing the inside of adhesive with a solder part formed by fusing and solidifying of the solder particles in the adhesive, the adhesion reinforcing unit configured to cause the adhesive to spread and contact a larger portion of the surface of the main body, the adhesive being formed in the adhesion reinforcing portion determined between the pair of electrodes on the substrate, wherein the adhesion reinforcing portion is formed on the surface of the substrate, extends contiguously between and partly overlaps the pair of electrodes to prevent short-circuiting of the pair of electrodes, and the portion determined between the pair of electrodes is set on a concave resist film of the adhesion reinforcing portion, and the solder part is held in the concave portion.

4. The electronic component mounting structure of claim 3, wherein the adhesion reinforcing portion is a position for covering a reinforcing electrode provided in a portion between the pair of electrodes on the substrate, and the adhesion reinforced part is formed as the solder particles in the adhesive supplied in the reinforcing electrode are fused to cover the solder part bonded on the reinforcing electrode, and the adhesive is thermally cured to bond the main body to the substrate.

* * * * *